(12) United States Patent
Yang et al.

(10) Patent No.: US 10,636,757 B2
(45) Date of Patent: Apr. 28, 2020

(54) INTEGRATED CIRCUIT COMPONENT PACKAGE AND METHOD OF FABRICATING THE SAME

(71) Applicant: Taiwan Semiconductor Manufacturing Co., Ltd., Hsinchu (TW)

(72) Inventors: Ching-Jung Yang, Taoyuan (TW); Ming-Yen Chiu, Hsinchu County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/690,196

(22) Filed: Aug. 29, 2017

(65) Prior Publication Data

US 2019/0067226 A1 Feb. 28, 2019

(51) Int. Cl.
*H01L 23/31* (2006.01)
*H01L 23/522* (2006.01)
(Continued)

(52) U.S. Cl.
CPC ............ *H01L 24/09* (2013.01); *H01L 21/568* (2013.01); *H01L 21/6835* (2013.01); *H01L 21/76819* (2013.01); *H01L 21/76837* (2013.01); *H01L 23/3121* (2013.01); *H01L 23/3171* (2013.01); *H01L 23/5226* (2013.01); *H01L 23/5389* (2013.01); *H01L 23/544* (2013.01); *H01L 24/11* (2013.01); *H01L 24/14* (2013.01); *H01L 24/19* (2013.01); *H01L 24/20* (2013.01); *H01L 24/96* (2013.01); *H01L 25/0657* (2013.01); *H01L 25/105* (2013.01); *H01L 2221/68318* (2013.01); *H01L 2221/68359* (2013.01); *H01L 2221/68372* (2013.01); *H01L 2221/68381* (2013.01); *H01L 2223/5442* (2013.01); *H01L 2223/5448* (2013.01); *H01L 2223/54426* (2013.01); *H01L 2224/18* (2013.01); *H01L 2224/48091* (2013.01); *H01L 2224/48227* (2013.01);
(Continued)

(58) Field of Classification Search
CPC ............. H01L 21/4846; H01L 21/4853; H01L 21/4857; H01L 21/56–568; H01L 2021/60–607; H01L 23/498; H01L 23/49805; H01L 2224/02333; H01L 2224/02379; H01L 2224/0401; H01L 2225/06513; H01L 2225/06517; H01L 2225/0652; H01L 2225/1058
See application file for complete search history.

(56) References Cited

U.S. PATENT DOCUMENTS 7,170,162 B2 * 1/2007 Chang ................. H01L 21/6835
257/700
8,778,738 B1 * 7/2014 Lin .................... H01L 23/49838
438/118

(Continued)

*Primary Examiner* — Maliheh Malek
(74) *Attorney, Agent, or Firm* — JCIPRNET (57) ABSTRACT

An integrated circuit package includes a die, a plurality of conductive vias, an alignment mark and an insulating encapsulation. The die includes a plurality of conductive pads. The conductive vias contacts the conductive pads respectively. The alignment mark is disposed on the die and spaced apart from the conductive vias. The insulating encapsulation encapsulates the die and contacts side surfaces of the conductive vias and the alignment mark.

19 Claims, 11 Drawing Sheets

(51) Int. Cl.
    *H01L 23/544*     (2006.01)
    *H01L 21/768*     (2006.01)
    *H01L 21/56*     (2006.01)
    *H01L 23/538*     (2006.01)
    *H01L 21/683*     (2006.01)
    *H01L 23/00*     (2006.01)
    *H01L 25/065*     (2006.01)
    *H01L 25/10*     (2006.01)

(52) U.S. Cl.
    CPC ............... *H01L 2224/73265* (2013.01); *H01L 2224/73267* (2013.01); *H01L 2924/00014* (2013.01); *H01L 2924/181* (2013.01)

(56) References Cited

U.S. PATENT DOCUMENTS

| | | | | |
|---|---|---|---|---|
| 8,829,676 | B2* | 9/2014 | Yu | H01L 21/568 257/737 |
| 8,877,554 | B2* | 11/2014 | Tsai | H01L 23/49816 438/106 |
| 9,059,107 | B2* | 6/2015 | Pan | H01L 21/56 |
| 9,318,429 | B2* | 4/2016 | Hu | H01L 23/49861 |
| 9,391,028 | B1* | 7/2016 | Chen | H01L 23/544 |
| 9,391,046 | B2* | 7/2016 | Park | H01L 23/3128 |
| 9,449,947 | B2* | 9/2016 | Yu | H01L 25/0657 |
| 9,460,987 | B2* | 10/2016 | Hung | H01L 23/481 |
| 9,484,227 | B1* | 11/2016 | Cheng | H01L 21/561 |
| 9,570,410 | B1* | 2/2017 | Chang | H01L 23/5386 |
| 9,589,903 | B2* | 3/2017 | Chen | H01L 24/20 |
| 9,595,482 | B2* | 3/2017 | Chen | H01L 23/481 |
| 9,640,531 | B1* | 5/2017 | Or-Bach | H01L 27/0688 |
| 9,653,391 | B1* | 5/2017 | Yew | H01L 23/49816 |
| 9,659,805 | B2* | 5/2017 | Hu | H01L 21/6835 |
| 9,666,502 | B2* | 5/2017 | Chen | H01L 21/4857 |
| 9,685,413 | B2* | 6/2017 | Chen | H01L 23/544 |
| 9,735,131 | B2* | 8/2017 | Su | H01L 25/0657 |
| 9,793,230 | B1* | 10/2017 | Yu | H01L 21/56 |
| 9,824,990 | B2* | 11/2017 | Chen | H01L 23/3128 |
| 9,825,006 | B2* | 11/2017 | Miki | H01L 25/0657 |
| 9,825,007 | B1* | 11/2017 | Chen | H01L 25/0657 |
| 9,837,359 | B1* | 12/2017 | Chiu | H01L 23/5389 |
| 9,847,269 | B2* | 12/2017 | Lin | H01L 21/565 |
| 9,859,229 | B2* | 1/2018 | Tsai | H01L 23/60 |
| 9,859,254 | B1* | 1/2018 | Yu | H01L 24/83 |
| 9,870,997 | B2* | 1/2018 | Chang | H01L 23/3128 |
| 9,911,672 | B1* | 3/2018 | Wu | H01L 25/105 |
| 9,922,895 | B2* | 3/2018 | Chiu | H01L 21/78 |
| 9,922,896 | B1* | 3/2018 | Cheng | H01L 24/03 |
| 9,935,080 | B2* | 4/2018 | Hung | H01L 25/0652 |
| 9,935,090 | B2* | 4/2018 | Yu | H01L 23/49816 |
| 9,966,360 | B2* | 5/2018 | Yu | G06K 9/00006 |
| 9,978,657 | B2* | 5/2018 | Liu | H01L 24/13 |
| 9,984,960 | B2* | 5/2018 | Hwang | H01L 23/49805 |
| 9,985,006 | B2* | 5/2018 | Jeng | H01L 21/4857 |
| 10,103,125 | B2* | 10/2018 | Yu | H01L 21/561 |
| 10,115,647 | B2* | 10/2018 | Huang | H01L 24/97 |
| 10,128,193 | B2* | 11/2018 | Chen | H01L 24/18 |
| 10,134,708 | B2* | 11/2018 | Yu | H01L 21/4853 |
| 10,141,288 | B2* | 11/2018 | Hsieh | H01L 25/105 |
| 10,157,807 | B2* | 12/2018 | Chiang | H01L 23/3128 |
| 10,157,846 | B2* | 12/2018 | Chen | H01L 23/5386 |
| 10,163,701 | B2* | 12/2018 | Lee | H01L 21/76885 |
| 10,163,745 | B2* | 12/2018 | Chiu | H01L 23/3107 |
| 10,163,800 | B2* | 12/2018 | Chen | H01L 23/5386 |
| 10,163,813 | B2* | 12/2018 | Lin | H01L 23/552 |
| 10,163,866 | B2* | 12/2018 | Chen | H01L 25/50 |
| 2009/0205202 | A1* | 8/2009 | Tanaka | H01L 24/82 29/834 |
| 2009/0206411 | A1* | 8/2009 | Koketsu | H01L 23/544 257/368 |
| 2009/0244865 | A1* | 10/2009 | Tanaka | H01L 23/5389 361/764 |
| 2010/0090352 | A1* | 4/2010 | Muramatsu | H01L 23/49811 257/778 |
| 2011/0248398 | A1* | 10/2011 | Parvarandeh | H01L 24/06 257/737 |
| 2011/0291288 | A1* | 12/2011 | Wu | H01L 24/17 257/774 |
| 2012/0153462 | A1* | 6/2012 | Wakiyama | H01L 21/563 257/737 |
| 2012/0313236 | A1* | 12/2012 | Wakiyama | H01L 23/544 257/734 |
| 2013/0062760 | A1* | 3/2013 | Hung | H01L 21/561 257/738 |
| 2013/0168848 | A1* | 7/2013 | Lin | H01L 24/19 257/737 |
| 2013/0187270 | A1* | 7/2013 | Yu | H01L 23/5389 257/737 |
| 2013/0307140 | A1* | 11/2013 | Huang | H01L 23/3107 257/737 |
| 2013/0341784 | A1* | 12/2013 | Lin | H01L 23/3121 257/737 |
| 2013/0341800 | A1* | 12/2013 | Tu | H01L 21/78 257/774 |
| 2014/0252646 | A1* | 9/2014 | Hung | H01L 23/481 257/774 |
| 2014/0287541 | A1* | 9/2014 | Yasumura | H01L 24/05 438/15 |
| 2014/0374899 | A1* | 12/2014 | Yang | H01L 23/49811 257/737 |
| 2015/0145145 | A1* | 5/2015 | Tsuyutani | H01L 24/05 257/774 |
| 2015/0235977 | A1* | 8/2015 | Shao | H01L 24/14 257/737 |
| 2015/0255406 | A1* | 9/2015 | Miao | H01L 24/11 257/684 |
| 2015/0287697 | A1* | 10/2015 | Tsai | H01L 23/60 257/770 |
| 2015/0311132 | A1* | 10/2015 | Kuo | H01L 24/13 257/737 |
| 2015/0318267 | A1* | 11/2015 | Yu | H01L 23/481 257/774 |
| 2015/0348904 | A1* | 12/2015 | Huang | H01L 21/76802 257/774 |
| 2016/0005716 | A1* | 1/2016 | Yu | H01L 25/0657 257/738 |
| 2016/0093572 | A1* | 3/2016 | Chen | H01L 21/4857 257/774 |
| 2016/0093580 | A1* | 3/2016 | Scanlan | H01L 23/48 257/737 |
| 2016/0163564 | A1* | 6/2016 | Yu | H01L 23/49838 257/774 |
| 2016/0163578 | A1* | 6/2016 | Yu | H01L 23/3107 257/738 |
| 2016/0190041 | A1* | 6/2016 | Gong | H01L 23/544 257/737 |
| 2016/0190098 | A1* | 6/2016 | Chen | H01L 23/3128 257/774 |
| 2016/0276248 | A1* | 9/2016 | Huang | H01L 24/97 |
| 2017/0005054 | A1* | 1/2017 | Chiu | H01L 24/14 |
| 2017/0005067 | A1* | 1/2017 | Yang | H01L 24/81 |
| 2017/0018534 | A1* | 1/2017 | Miki | H01L 25/0657 |
| 2017/0084589 | A1* | 3/2017 | Kuo | H01L 25/105 |
| 2017/0092581 | A1* | 3/2017 | Chiu | H01L 21/565 |
| 2017/0110421 | A1* | 4/2017 | Liu | H01L 21/561 |
| 2017/0133354 | A1* | 5/2017 | Chen | H01L 25/105 |
| 2017/0188458 | A1* | 6/2017 | Hsieh | H05K 1/111 |
| 2017/0271283 | A1* | 9/2017 | Lee | H01L 24/02 |
| 2017/0323840 | A1* | 11/2017 | Chiu | H01L 21/78 |
| 2017/0338196 | A1* | 11/2017 | Chiu | H01L 24/14 |
| 2017/0345762 | A1* | 11/2017 | Chiu | H01L 23/5389 |
| 2018/0013052 | A1* | 1/2018 | Oliver | H01L 25/0657 |
| 2018/0025986 | A1* | 1/2018 | Chiu | H01L 23/5389 257/531 |
| 2018/0061669 | A1* | 3/2018 | Liao | H01L 21/563 |
| 2018/0082988 | A1* | 3/2018 | Cheng | H01L 21/561 |
| 2018/0096939 | A1* | 4/2018 | Chiu | H01L 23/5389 |
| 2018/0096943 | A1* | 4/2018 | Chiu | H01L 23/5389 |
| 2018/0138115 | A1* | 5/2018 | Lu | H01L 23/49838 |
| 2018/0151493 | A1* | 5/2018 | Ku | H01L 23/5227 |
| 2018/0204780 | A1* | 7/2018 | Chiu | H01L 21/78 |

(56) References Cited

U.S. PATENT DOCUMENTS

| | | | | |
|---|---|---|---|---|
| 2018/0301389 A1* | 10/2018 | Liu | .................... | H01L 21/568 |
| 2018/0350784 A1* | 12/2018 | Cheng | .................... | H01L 21/561 |
| 2018/0366347 A1* | 12/2018 | Chuang | .................... | H01L 23/5389 |
| 2018/0366410 A1* | 12/2018 | Chen | .................... | H01L 23/5389 |
| 2018/0366412 A1* | 12/2018 | Hsieh | .................... | H01L 25/105 |
| 2018/0374797 A1* | 12/2018 | Hu | .................... | H01L 21/486 |
| 2018/0374822 A1* | 12/2018 | Yu | .................... | H01L 21/6835 |
| 2018/0374824 A1* | 12/2018 | Yu | .................... | H01L 25/0652 |
| 2019/0035759 A1* | 1/2019 | Tsai | .................... | H01L 24/25 |
| 2019/0067001 A1* | 2/2019 | Chen | .................... | H01L 24/19 |
| 2019/0131249 A1* | 5/2019 | Hsieh | .................... | H01L 23/544 |
| 2019/0355679 A1* | 11/2019 | Wu | .................... | H01L 23/66 |

* cited by examiner

INTEGRATED CIRCUIT COMPONENT PACKAGE AND METHOD OF FABRICATING THE SAME

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon. Many integrated circuits are typically manufactured on a single semiconductor wafer. The dies of the wafer may be processed and packaged at the wafer level, and various technologies have been developed for wafer level packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

Figures 1, 2:
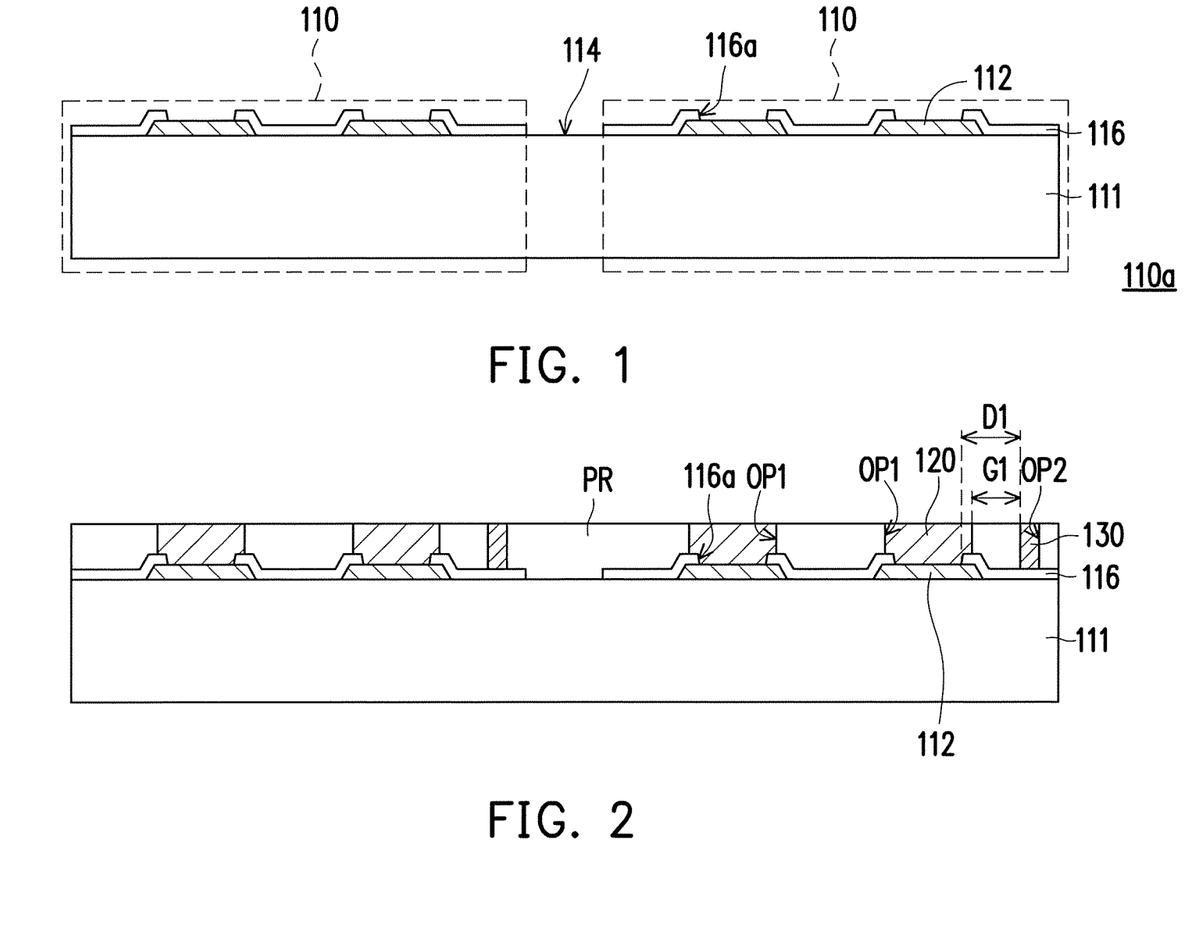
FIG. 1 to FIG. 11 illustrate a process flow for fabricating an integrated circuit package in accordance with some embodiments.

FIG. 1 to FIG. 11 illustrate a process flow for fabricating an integrated fan-out package in accordance with some embodiments. In some embodiments, the integrated circuit package 100 is an integrated fan-out (InFO) package. The method for fabricating an integrated circuit package 100 may include the following steps. Referring to FIG. 1, a wafer 110a including a plurality of semiconductor die 110 arranged in an array is provided. Before a wafer dicing process is performed on the wafer 110a, semiconductor die 110 of the wafer 110a are connected one another. In some embodiments, the wafer 110a includes a semiconductor substrate 111, plurality of conductive pads 112 and a passivation layer 116. The conductive pads 112 are formed on an active surface 114 of the semiconductor substrate 111. The passivation layer 116 is formed on the wafer 110a. In some embodiments, the passivation layer 116 is formed on the active surface 114 and includes a plurality of first openings 116a corresponding to the conductive pads 112 respectively. In one embodiment, the first openings 116a are located on the conductive pads 112 and the passivation layer 116 partially covers the conductive pads 112. In other words, the conductive pads 112 are partially exposed by the first openings 116a of the passivation layer 116. For example, the semiconductor substrate 111 of the wafer 110a may be a silicon substrate, which includes active components (e.g., transistors or the like) and/or passive components (e.g., resistors, capacitors, inductors or the like) formed therein. The conductive pads 120 may be aluminum pads, copper pads or other suitable metal pads. The passivation layer 116 may be a silicon oxide layer, a silicon nitride layer, a silicon oxy-nitride layer or a dielectric layer foamed by other suitable dielectric materials. In one embodiment, the passivation layer 116 is a single-layered passivation layer 116 and may be directly in contact with the active surface 114. With this arrangement, multiple layers of the passivation layers on the semiconductor die 110 may be omitted so as to reduce the production cost of the integrated circuit package.

Referring to FIG. 2, a patterned photoresist layer PR is formed on the passivation layer 116. The patterned photoresist layer PR includes a plurality of first pattern openings OP1 and a second pattern opening OP2. The first pattern openings OP1 reveals the first openings 116a of the passivation layer 116 and the conductive pads 112 underneath the first openings 116a. The second pattern opening OP2 reveals the passivation layer 116. Then, a plurality of conductive vias 120 are formed in the first pattern openings OP1 and at least one alignment mark 130 is formed in the second pattern opening OP2. Accordingly, the conductive vias 120 may be in direct contact with the conductive pads 112 respectively, and the alignment mark 130 may be in direct contact with the passivation layer 116. In some embodiments, the alignment mark 130 is spaced apart from the conductive vias 120. Accordingly, a gap G1 exists between the alignment mark 130 and the conductive vias 120. In other words, the alignment mark 130 maintains a distance from the first openings 116a. In addition, another gap exists between the alignment mark 130 and the conductive pads 112. In some embodiments, the passivation layer 116 may be partially covered by the conductive vias 120, and the alignment mark 130 is separated from the active surface 114 by the passivation layer 116.

In some embodiments, the conductive vias 120 are formed on the conductive pads 112 through plating. For example, before the patterned photoresist layer PR is formed, a seed layer may be firstly sputtered onto the passivation layer 116 and the conductive pads 112 exposed by the passivation layer 116. Then, the patterned photoresist layer PR including the first pattern openings OP1 and the second pattern opening OP2 is then formed over the seed layer by photolithography. The wafer 110a with the patterned photoresist layer PR formed thereon is then immersed into a plating solution such that the conductive vias 120 and the alignment mark 130 are plated on the seed layer that is corresponding in position to the first pattern openings OP1 and the second pattern opening OP2.

Figure 3:
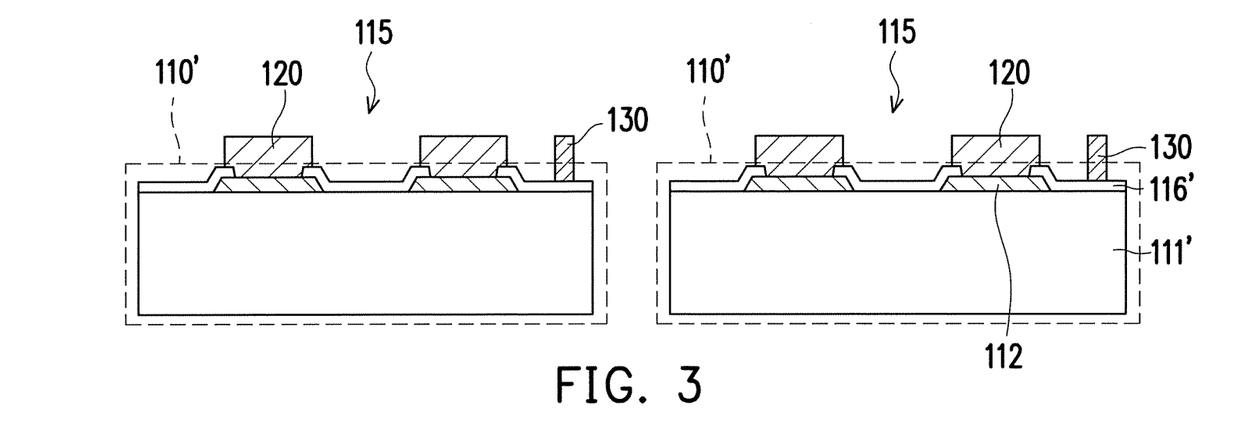

Referring to FIG. 3, after the conductive vias 120 and the alignment mark 130 are formed, the patterned photoresist layer PR is removed. Thereafter, by using the conductive vias 120 and the alignment mark 130 as a hard mask, portions of the seed layer that are not covered by the conductive vias 120 and the alignment mark 130 are removed by etching process, for example, until the passivation layer 116 is revealed. In some embodiments, the conductive vias 120 are copper vias or other metallic vias.

Figure 13:
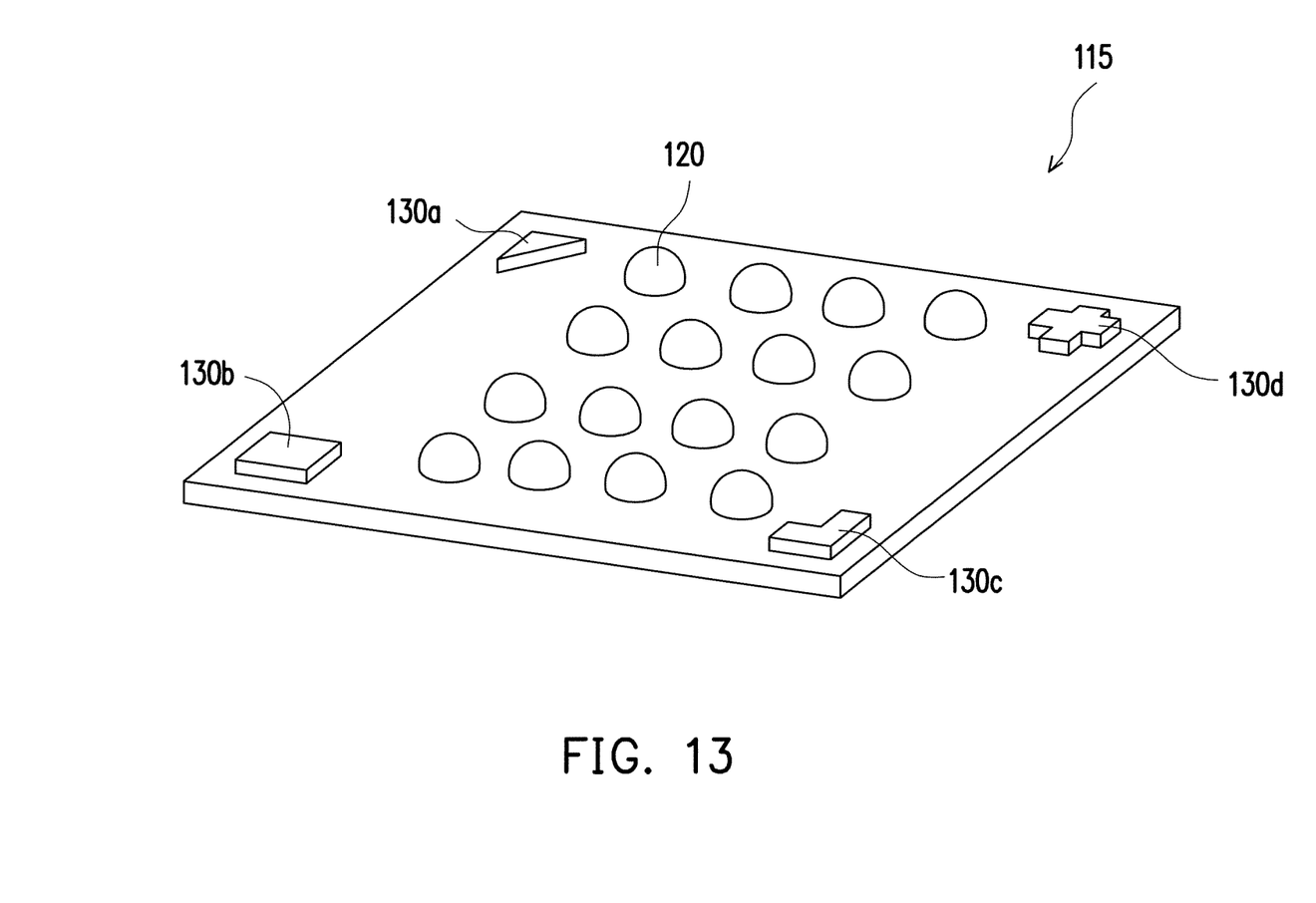
FIG. 13 is a schematic view illustrating an integrated circuit component in accordance with some embodiments.

FIG. 13 is a schematic view illustrating an integrated circuit component in accordance with some embodiments. Referring to FIG. 3 and FIG. 13, in some embodiments, the conductive vias 120 and the alignment mark 130 are fabricated by the same process (e.g., a plating process). In such embodiments, the material of the conductive vias 120 is substantially the same with that of the alignment mark 130. In some embodiments, the alignment mark 130 may be a triangular alignment mark 130a, a rectangular alignment mark 130b, a L-shaped alignment mark 130c, a cross-shaped alignment mark 130d, or an alignment mark with other suitable shapes. In other words, a top view of the alignment mark 130 may be in triangle shape, rectangle shape, cross shape or L shape. The shape and number of the alignment mark 130 are not limited thereto according to the present disclosure. In some embodiments, the integrated circuit component 115 may include more than one alignment marks 130, and the shapes of the alignment marks 130 may be the same or different from one another.

Then, referring to both FIG. 2 and FIG. 3, a back side grinding process may be performed on a rear surface of semiconductor substrate 111 after the conductive vias 120 and the alignment mark 130 are formed. The semiconductor substrate 111 is grinded such that a thinned wafer including a thinned semiconductor substrate 111', the conductive pads 112, the passivation layer 116, the conductive vias 120, and the alignment mark 130 is formed.

Then, after performing the back side grinding process, a wafer dicing process is performed to dice the thinned wafer into a plurality of integrated circuit components 115 as shown in FIG. 3. Each of the integrated circuit components 115 includes the semiconductor die 110', the conductive vias 120 and the alignment mark 130, wherein the conductive vias 120 contact the conductive pads 112 of the semiconductor die 110' respectively and are spaced apart from the alignment mark 130. The materials and properties of the semiconductor die 110' including the semiconductor substrate 111' and the passivation layer 116' are similar with those of the semiconductor substrate 111 and the passivation layer 116 as shown in FIG. 1. Thus, the detailed descriptions of the semiconductor substrate 111' and the passivation layer 116' are omitted herein for the sake of brevity.

Figure 4:
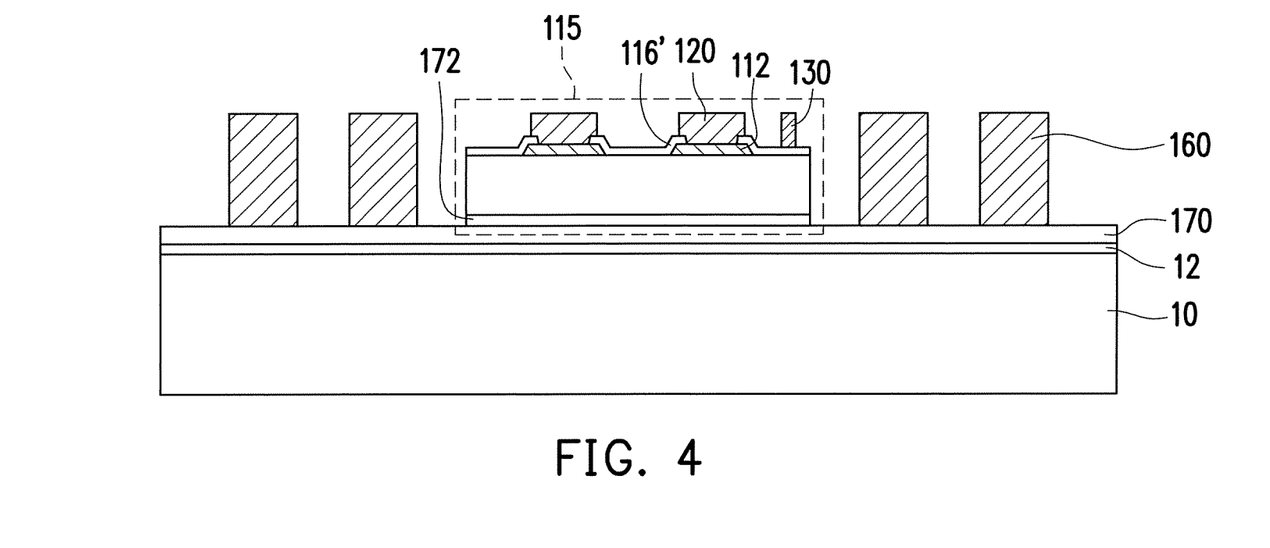

Referring to FIG. 4, a carrier 10 having a de-bonding layer 12 and an insulating layer 170 formed thereon is provided, wherein the de-bonding layer 12 is disposed between the carrier 10 and the insulating layer 170. In some embodiments, the carrier 10 may be a glass substrate, the de-bonding layer 12 may be a light to heat conversion (LTHC) release layer formed on the glass substrate, and the insulating layer 170 may be a polybenzoxazole (PBO) layer formed on the de-bonding layer 12, for example. It is noted that, in some embodiments, the insulating layer 170 may be omitted. In other words, the formation of the insulating layer 170 is optional in some alternative embodiments. It may also be noted that materials for the carrier 10, the de-bonding layer 12, and the insulating layer 170 are not limited to what are disclosed herein according to the present disclosure.

After the carrier 10 having the de-bonding layer 12 formed thereon is provided, a plurality of conductive pillars 160 are formed on the carrier 10. In some embodiments, the conductive pillars 160 are formed over the carrier 10 (e.g. on the insulating layer 170 or on the de-bonding layer 12 if the insulating layer 170 is omitted) by photolithography, plating, and photoresist stripping process. In some alternative embodiments, the conductive pillars 160 may be pre-fabricated through other processes and are mounted over the carrier 10. For example, the conductive pillars 160 include copper posts or other metallic posts.

Then, in some embodiments, one of the integrated circuit components 115 including the conductive vias 120 and the alignments mark 130 as shown in FIG. 3 may be picked-up and placed on the carrier 10. The integrated circuit component 115 may be attached or adhered on the carrier 10 through a die attach film 172, an adhesion paste or the like. In some alternative embodiments, more than one of the integrated circuit components 115 may be picked-up and placed on the carrier 10 and the integrated circuit components 115 which are removably bonded to the carrier 10 may be arranged in an array. When the integrated circuit components 115 placed on the carrier 10 are arranged in an array, the conductive pillars 160 may be divided into groups corresponding to the number of the integrated circuit components 115. For the sake of clarity and brevity, one integrated circuit component 115 is depicted in the disclosure, but the number of the integrated circuit components 115 is not limited thereto.

In some embodiments, the integrated circuit component 115 may have a thickness less than a height of the conductive pillars 160. However, the disclosure is not limited thereto. In some alternative embodiments, the thickness of the integrated circuit component 115 may be greater than or substantially equal to the height of the conductive pillars 160.

As shown in FIG. 4, one or more of the integrated circuit components 115 may be picked-up and placed on the carrier 10 after the formation of the conductive pillars 160. However, the disclosure is not limited thereto. In some alternative embodiments, one or more of the integrated circuit components 115 may be picked-up and placed on carrier 10 before the forrmulation of the conductive pillars 160.

Figure 5:
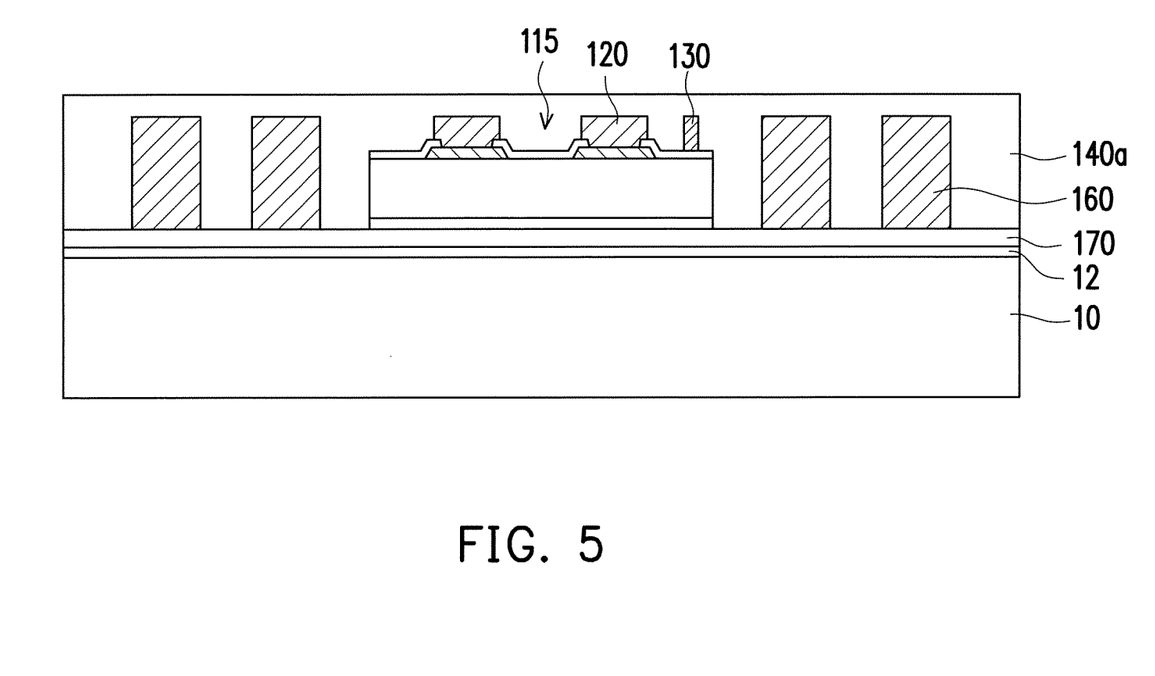

Referring to FIG. 5, an insulating encapsulation 140a is formed over the carrier 10 (e.g., on the insulating layer 170 or on the de-bonding layer 12 if the insulating layer 170 is omitted) to encapsulate the integrated circuit component 115 including the semiconductor die 110'. The insulating encapsulation 140a encapsulates and is in contact with side surfaces of the conductive vias 120 and the alignment mark 130. The insulating encapsulation 140a fills the gap between the conductive vias 120 and the alignment mark 130 and the gap between the conductive pads 112 and the alignment mark 130. In addition, the insulating encapsulation 140a fills the gap between the conductive vias 120, and the gap between the conductive pillars 160. In some embodiments, the insulating encapsulation 140a is a single-layered insulating encapsulation, which may include a molding compound formed by a molding process. The material of the insulating encapsulation 140a may include epoxy or other suitable resins. For example, the insulating encapsulation 140a may be epoxy resin containing chemical filler.

Figure 6:
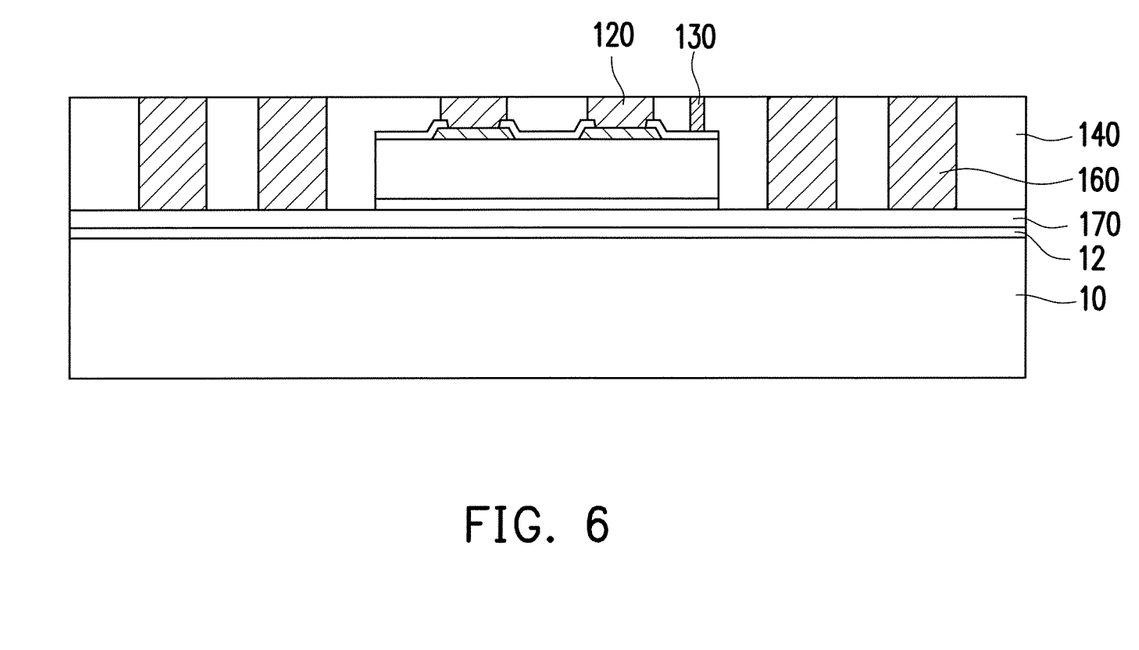

Referring to FIG. 5 and FIG. 6, the insulating encapsulation 140a, as well as the conductive pillars 160 in some embodiments, is ground until the top surfaces of the conductive vias 120 and the alignment mark 130 are revealed. After the insulating encapsulation 140a is ground, an insulating encapsulation 140 as shown in FIG. 6 is formed. A ground surface of the insulating encapsulation 140 is substantially coplanar with the top surfaces of the conductive vias 120 and the alignment mark 130. In some embodiments, during the grinding process of the insulating encapsulation 140a, top portions of the conductive pillars 160, the conductive vias 120 and the alignment mark 130 may also be ground. In such embodiments, the ground surface of the insulating encapsulation 140 is substantially coplanar with ground top surfaces of the conductive pillars 160, ground top surfaces of the conductive vias 120 and a ground top surface of the alignment mark 130. The insulating encapsulation 140 may be formed by mechanical grinding or chemical mechanical polishing (CMP), for example.

The insulating encapsulation 140 fills between the conductive vias 120 and the alignment mark 130, and is in contact with the side surfaces of the conductive vias 120 and the alignment mark 130. In other words, the integrated circuit component 115 and the conductive pillars 160 are mostly embedded in the insulating encapsulation 140 with merely the top surfaces thereof being revealed. The materials and properties of the insulating encapsulation 140 are similar with those of the insulating encapsulation 140a as shown in FIG. 5. Thus, the detailed descriptions of the insulating encapsulation 140 are omitted herein for the sake of brevity.

In some embodiments, a plurality of grinding marks (not shown) resulted from the grinding process may be generated and distributed on the top surfaces of the conductive vias 120. Furthermore, the above-mentioned grinding marks are not only found on the top surfaces of the conductive vias 120, but also found on the top surface of the alignment mark 130, the top surfaces of the conductive pillars 160, and the ground surface of the insulating encapsulation 140. In some embodiments, the rough grinded surface of the alignment mark 130 are recognizable and feasible in an infrared (IR) alignment process because the IR alignment process is less sensitive to roughness of the grinded surfaces of the alignment mark 130.

Figure 7:
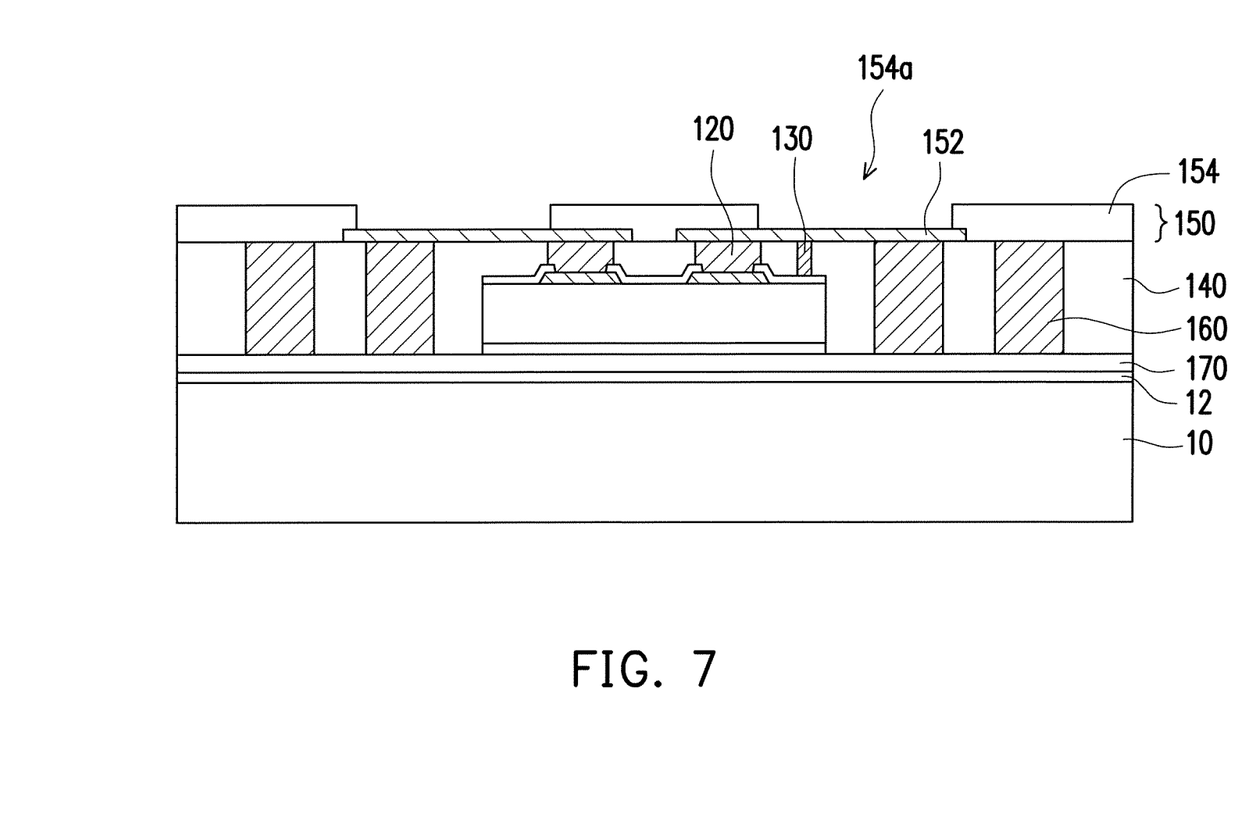

Referring to FIG. 7, after the insulating encapsulation 140 is formed and ground, a redistribution layer 150 is formed on the insulating encapsulation 140 and the integrated circuit component 115 including the semiconductor die 110'. In some embodiments, the fabrication process of the redistribution layer 150 may include the following steps. For example, a redistribution circuit layer 152 is formed on the ground surface of the insulating encapsulation 140, and a dielectric layer 154 is then formed on the ground surface of the insulating encapsulation 140 and the redistribution circuit layer 150.

In some embodiments, the redistribution circuit layer 152 connects the ground surface of the insulating encapsulation 140, the top surfaces of the conductive vias 120, the alignment mark 130 and the conductive pillars 160. The redistribution circuit layer 152 is fabricated to electrically connect with one or more connectors underneath. Here, the afore-said connectors may be the conductive vias 120 and/or the conductive pillars 160. In some embodiments, the alignment mark may be electrically connected to the conductive vias 120 through the redistribution circuit layer 152 as it is shown in FIG. 7. In other embodiments, the alignment mark 130 may be electrically insulated from the conductive vias 120. In other words, the alignment marks 130 may or may not be in contact with the redistribution circuit layer 152. The redistribution circuit layer 152 may include a plurality of ball pads for mounting of conductive balls and at least one connection pad for mounting of passive components. The dielectric layer 154 includes a plurality of second openings 154a located on the redistribution circuit layer 152 for revealing the ball pads and the connection pad of the redistribution circuit layer 152. With the arrangement of the redistribution circuit layer 152 directly connecting the conductive vias 120, the alignment mark 130 and the conductive pillars 160, the bottommost dielectric layer of the redistribution layer 150 may be omitted to further reduce the production cost.

In some embodiments, the redistribution layer 150 may further include a plurality of dielectric layers and a plurality of redistribution circuit layers stacked alternately. In some embodiments, the top surfaces of the conductive vias 120, the alignment mark 130 and the conductive pillars 160 may be in contact with the bottommost one of the redistribution circuit layers. The top surfaces of the conductive vias 120, the alignment mark 130 and the conductive pillars 160 are partially covered by the bottommost dielectric layers.

Figure 8:
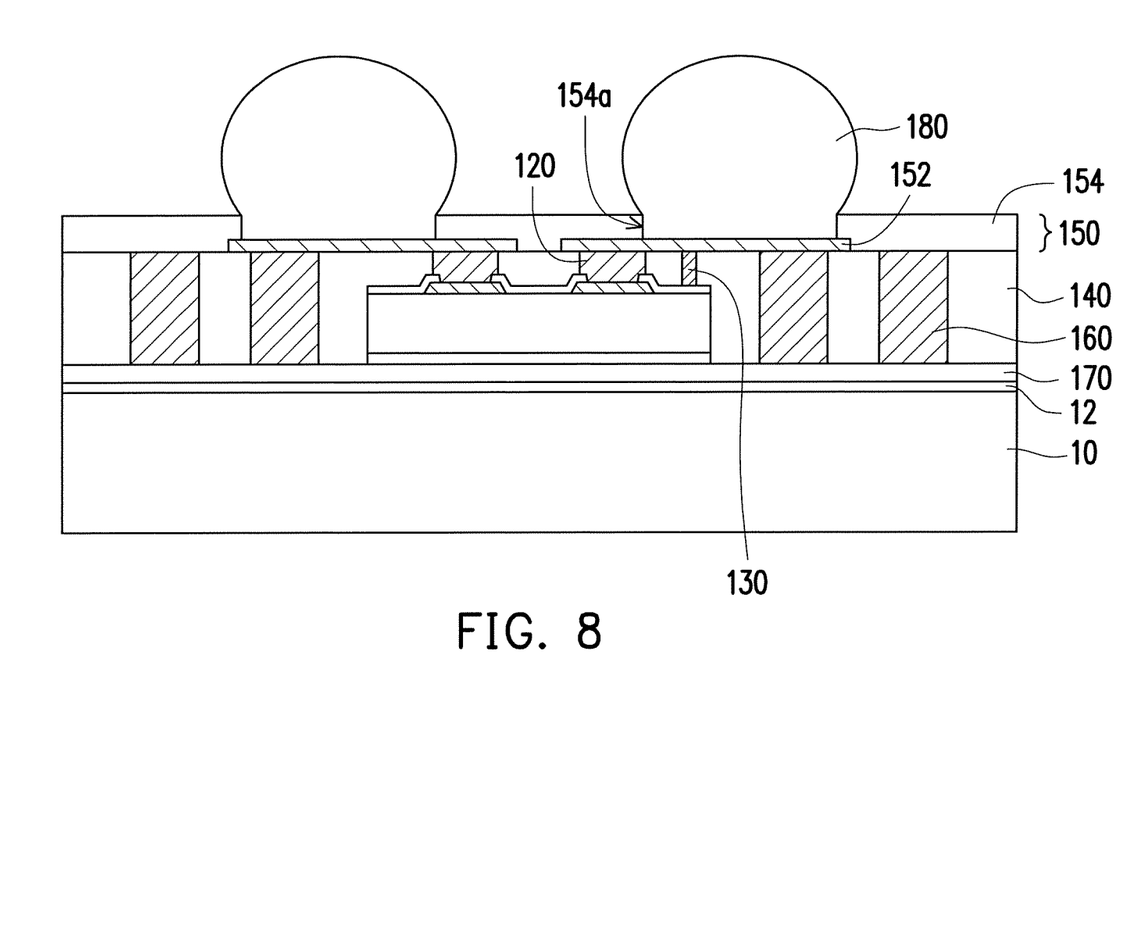

Referring to FIG. 8, after the redistribution layer 150 is formed, a plurality of conductive balls 180 are formed in the second openings 154a. The conductive balls 180 are in contact with the redistribution circuit layer 152 through the second openings 154a. In some embodiments, the conductive balls 180 fill the second openings 154a. In other words, the conductive balls 180 are directly mounting on the pads of the redistribution circuit layer 152 through the second openings 154a. Namely, with the arrangement, a plurality of under-ball metallurgy (UBM) patterns for ball mount may be omitted to further reduce the production cost. In some embodiments, the conductive balls 180 may be placed on pads of the redistribution circuit layer 152 through ball placement process and at least one passive component may be mounted on the connection pads of the redistribution circuit layer 152 through soldering process.

Figure 9:
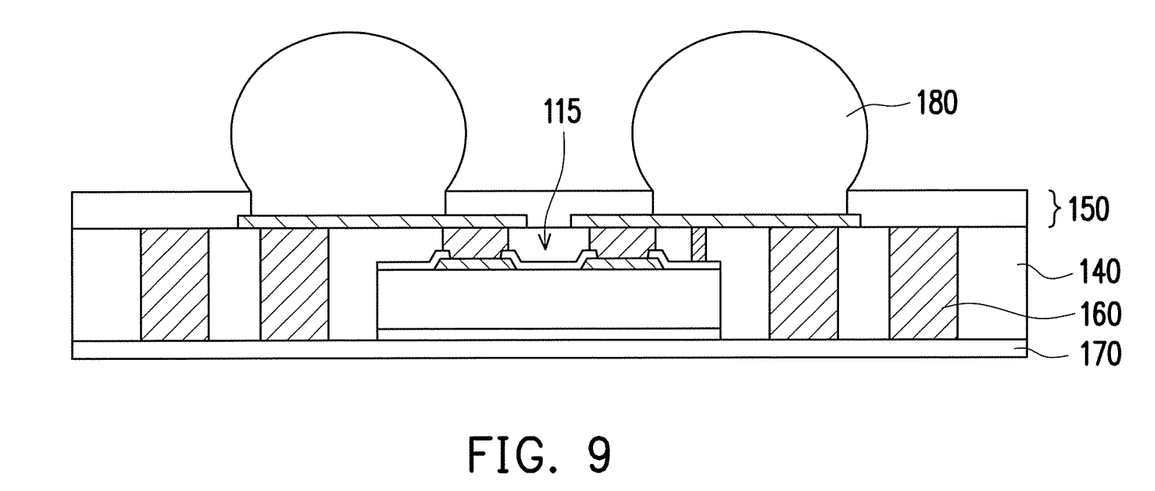

Referring to FIG. 8 and FIG. 9, after the redistribution layer 150, the conductive balls 180 and/or the passive component are formed, the de-bonding layer 12 is de-bonded from the insulating layer 170 (if any), the insulating encapsulation 140 and the integrated circuit component 115 carried by the carrier 10 to form the structure shown in FIG. 9. In embodiments of the de-bonding layer 12 being the LTHC release layer, an UV laser irradiation process may be performed on the de-bonding layer 12 to facilitate peeling of the de-bonding layer 12 and the carrier 10.

Figure 10:
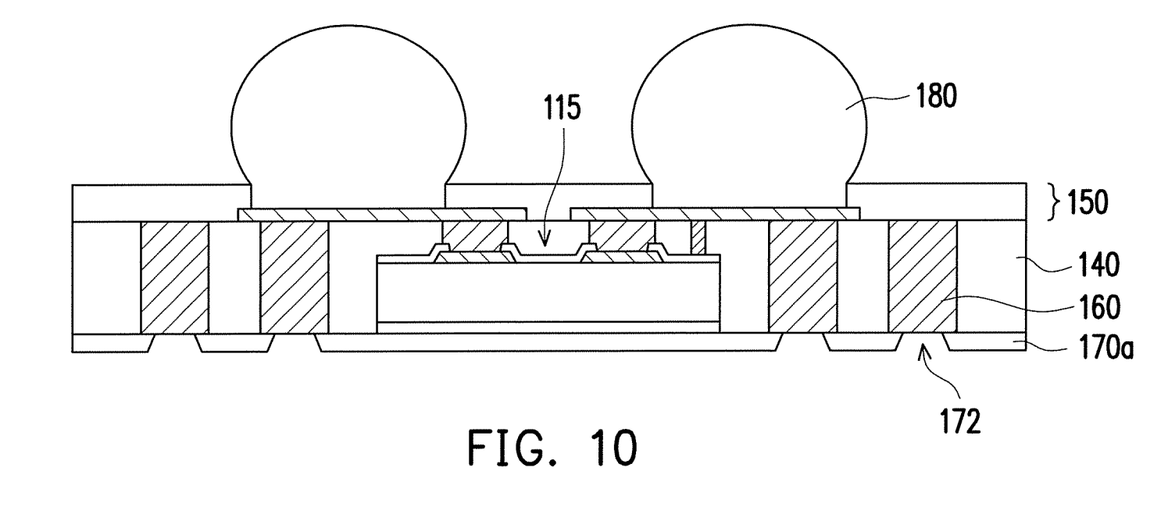

Referring to FIG. 10, in some embodiments, the insulating layer 170 may be further patterned so as to form the insulating layer 170a including a plurality of contact openings 172. The contact openings 172 correspond to the conductive pillars 160 to reveal bottom surfaces of the conductive pillars 160. The number of the contact openings 172 may correspond to the number of the conductive pillars 160. In some embodiments, the contact openings 172 in the insulating layer 170 may be formed by laser drilling process, photolithography process or other suitable processes.

Figure 11:
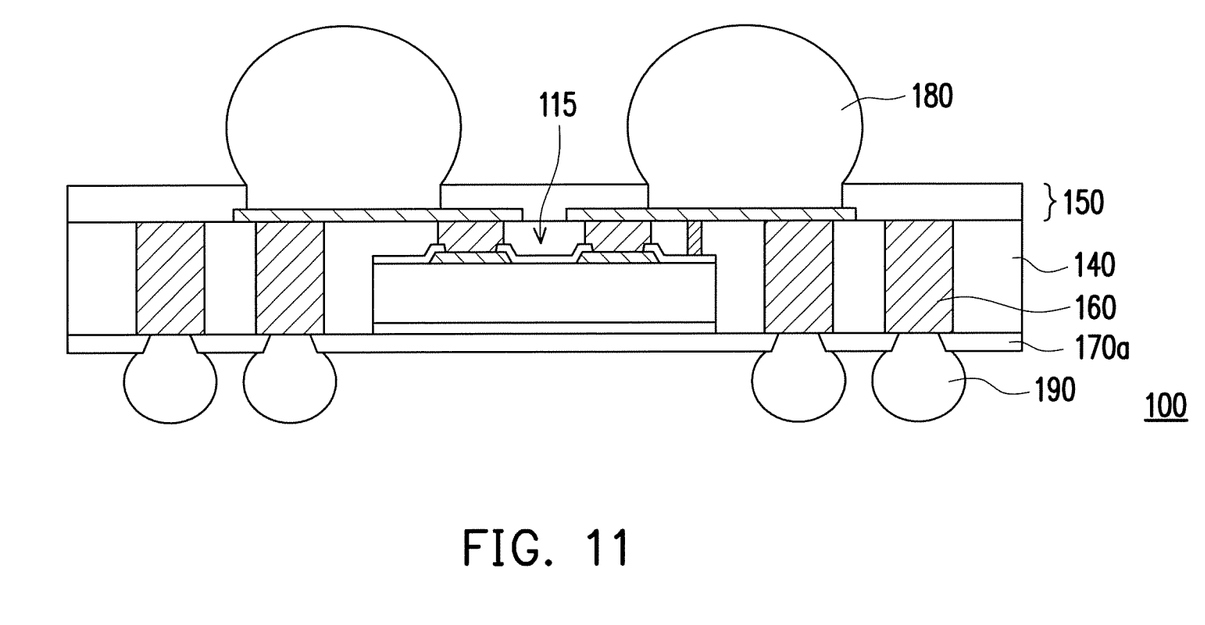

Referring to FIG. 11, after the contact openings 172 are formed in the insulating layer 170, a plurality of conductive balls 190 are formed on the bottom surfaces of the conductive pillars 160 through the contact openings 172. In addition, the conductive balls 190 may be, for example, reflowed to bond with the bottom surfaces of the conductive pillars 160. After the conductive balls 190 are formed, the formation of an integrated circuit package 100, e.g. integrated fan-out (InFO) package, of the integrated circuit component 115 having dual-side terminals is accomplished. At this point, the fabrication process of the integrated circuit package 100 may be substantially done.

Figure 11A:
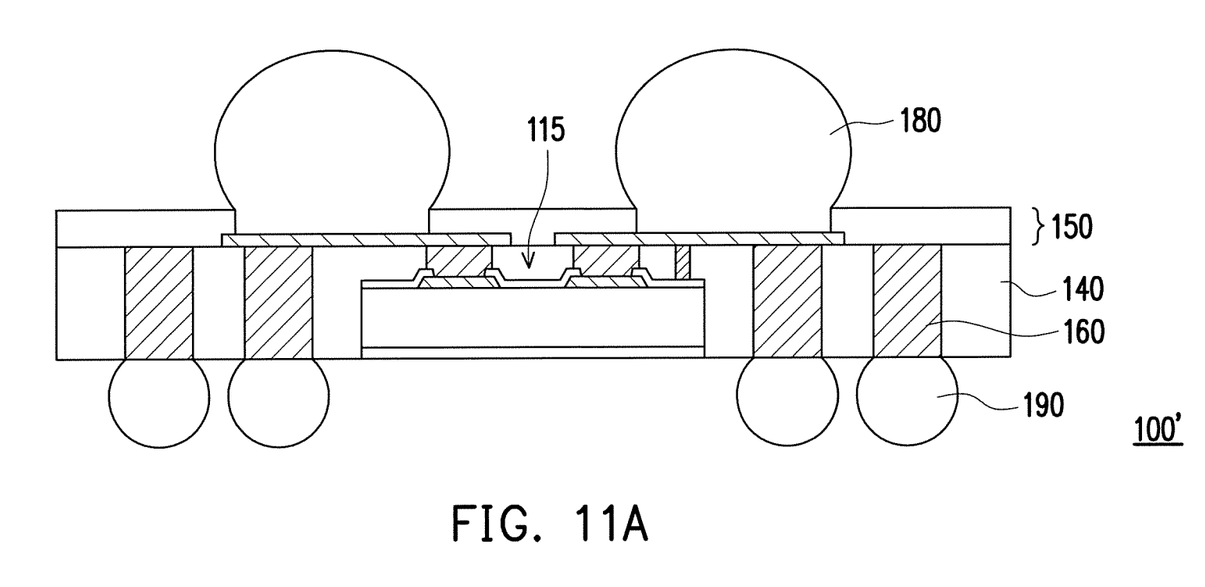
FIG. 11A illustrates a cross sectional view of an integrated circuit package in accordance with some embodiments.

FIG. 11A illustrates a cross sectional view of an integrated circuit package in accordance with some embodiments. Referring to FIG. 11A, in some alternative embodiments, the carrier 10 may not include the insulating layer 170 formed thereon. In such embodiment, during the de-bonding process, the de-bonding layer 12 is de-bonded from the insulating encapsulation 140 and the integrated circuit component 115 carried by the carrier 10. Accordingly, a bottom surface of the insulating encapsulation 140, a bottom surface of the integrated circuit component 115 (with the die attach film) and bottom surfaces of the conductive pillars 116 are revealed. Then, a plurality of conductive balls 190 are directly formed on the bottom surfaces of the conductive pillars 160 without the insulating layer 170 surrounding the conductive balls 190. In addition, the conductive balls 190 may be, for example, reflowed to bond with the bottom surfaces of the conductive pillars 160. After the conductive balls 190 are formed, the formation of an integrated circuit package 100', e.g. integrated fan-out (InFO) package, of the integrated circuit component 115 having dual-side terminals is accomplished.

Figure 12:
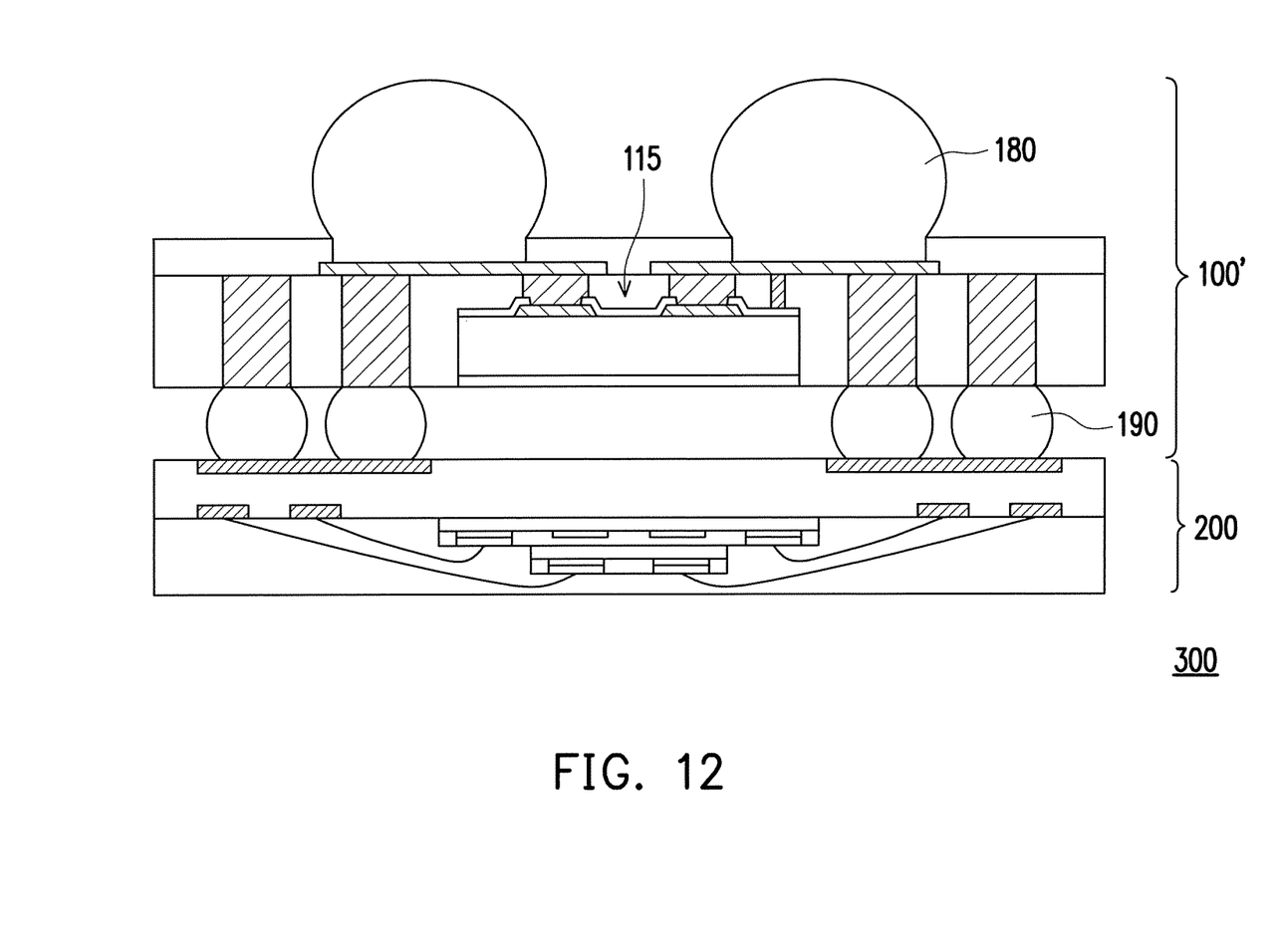
FIG. 12 is a cross-sectional view illustrating a package-on-package (POP) structure in accordance with some embodiments.

FIG. 12 is a cross-sectional view illustrating a package-on-package (POP) structure in accordance with some embodiments. Referring to FIG. 12, another package 200 may be provided. In some embodiments, the package 200 provided is, for example, a memory device, etc. The package 200 may be stacked over and electrically connected to the integrated circuit package 100 illustrated in FIG. 11 or the integrated circuit package 100' illustrated in FIG. 11A through the conductive balls 190, such that a package-on-package (POP) structure 300 is fabricated.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In accordance with some embodiments of the present disclosure, an integrated circuit package includes a semiconductor die, a plurality of conductive vias, an alignment mark and an insulating encapsulation. The semiconductor die includes an active surface and a plurality of conductive pads disposed on the active surface. The conductive vias are in contact with the conductive pads respectively. The alignment mark is disposed on the semiconductor die and spaced apart from the conductive vias. The insulating encapsulation encapsulates the semiconductor die and is in contact with side surfaces of the conductive vias and the alignment mark.

In accordance with some embodiments of the present disclosure, the semiconductor die further includes a passivation layer covering the active surface and including a plurality of first openings located on the conductive pads.

In accordance with some embodiments of the present disclosure, the conductive vias are electrically connected to the conductive pads through the first openings, and the passivation layer is partially covered by the conductive vias.

In accordance with some embodiments of the present disclosure, the alignment mark is disposed on the passivation layer and is separated from the active surface by the passivation layer.

In accordance with some embodiments of the present disclosure, the passivation layer is a single-layered passivation layer.

In accordance with some embodiments of the present disclosure, a top surface of the insulating encapsulation is substantially coplanar with top surfaces of the conductive vias and the alignment mark.

In accordance with some embodiments of the present disclosure, the insulating encapsulation includes a molding compound.

In accordance with some embodiments of the present disclosure, the integrated circuit package further includes a redistribution layer disposed on the insulating encapsulation and the semiconductor die. The redistribution layer includes a redistribution circuit layer and a dielectric layer. The redistribution circuit layer is in contact with top surfaces of the insulating encapsulation, the conductive vias and the alignment mark. The dielectric layer is disposed on the insulating encapsulation and the redistribution circuit layer.

In accordance with some embodiments of the present disclosure, the integrated circuit package further includes a plurality of conductive balls, wherein the dielectric layer includes a plurality of second openings disposed on the redistribution circuit layer, and the conductive balls are disposed in the second openings and in contact with the redistribution circuit layer through the second openings.

In accordance with some embodiments of the present disclosure, an integrated circuit package includes a semiconductor die, a plurality of conductive vias, an alignment mark, an insulating encapsulation and a redistribution layer. The semiconductor die includes a plurality of conductive pads disposed on an active surface of the semiconductor die and a passivation layer covering the active surface, wherein the passivation layer includes a plurality of first openings corresponding to the conductive pads. The conductive vias are disposed in the first openings and in contact with the conductive pads through the first openings. The alignment mark is disposed on the passivation layer and separated from the active surface by the passivation layer, wherein the alignment mark maintains a distance from the first openings. The insulating encapsulation encapsulates side surfaces of the semiconductor die and is in contact with the passivation layer, wherein the alignment mark is separated from the conductive vias by the insulating encapsulation. The redistribution layer is disposed on the insulating encapsulation and the semiconductor die.

In accordance with some embodiments of the present disclosure, the insulating encapsulation contacts and fills between the conductive vias and the alignment mark.

In accordance with some embodiments of the present disclosure, a top surface of the insulating encapsulation is substantially coplanar with top surfaces of the conductive vias and the alignment mark.

In accordance with some embodiments of the present disclosure, the passivation layer is a single-layered passivation layer.

In accordance with some embodiments of the present disclosure, the redistribution layer includes a redistribution circuit layer and a dielectric layer. The redistribution circuit layer is in contact with top surfaces of the insulating encapsulation, the conductive vias and the alignment mark. The dielectric layer is disposed on the insulating encapsulation and the redistribution circuit layer.

In accordance with some embodiments of the present disclosure, the integrated circuit package further includes a plurality of conductive balls, wherein the dielectric layer includes a plurality of second openings disposed on the redistribution circuit layer, and the conductive balls are disposed in the second openings respectively and in contact with the redistribution circuit layer through the second openings.

In accordance with some embodiments of the present disclosure, a method of fabricating an integrated circuit package includes the following steps. An integrated circuit component which is removably bonded to a carrier is provided, wherein the integrated circuit component includes a semiconductor die, a plurality of conductive vias and an alignment mark, the conductive vias contact a plurality of conductive pads of the semiconductor die respectively and are spaced apart from the alignment mark. An insulating encapsulation is formed over the carrier to encapsulate the integrated circuit component, wherein the insulating encapsulation fills between the conductive vias and the alignment mark, and contacts side surfaces of the conductive vias and the alignment mark. The insulating encapsulation is ground until top surfaces of the conductive vias and the alignment mark are revealed, wherein a ground surface of the insulating encapsulation is substantially coplanar with the top surfaces of the conductive vias and the alignment mark.

In accordance with some embodiments of the present disclosure, providing the integrated circuit component includes the following steps. A wafer including the semiconductor die is provided. A passivation layer is formed on the wafer, wherein the passivation layer includes a plurality of first openings corresponding to the conductive pads respectively. A patterned photoresist layer is formed on the passivation layer, wherein the patterned photoresist layer includes a plurality of first pattern openings and a second pattern opening, the first pattern openings reveals the first openings and the conductive pads, and the second pattern opening reveals the passivation layer. The conductive vias are formed in the first pattern openings and the alignment mark is formed in the second pattern opening. The patterned photoresist layer is removed. The wafer is diced to form the integrated circuit component.

In accordance with some embodiments of the present disclosure, a plurality of conductive pillars are formed on the carrier before the integrated circuit component is removably bonded to the carrier, and the insulating encapsulation encapsulates side surfaces of the conductive pillars.

In accordance with some embodiments of the present disclosure, the method further includes the following steps. A redistribution circuit layer is formed on the ground surface of the insulating encapsulation, wherein the redistribution circuit layer connects the top surfaces of the conductive vias and the alignment mark. A dielectric layer is formed on the ground surface of the insulating encapsulation and the redistribution circuit layer, wherein the dielectric layer includes a plurality of second openings disposed on the redistribution circuit layer.

In accordance with some embodiments of the present disclosure, the method further includes the following steps. A plurality of conductive balls are formed in the second openings, wherein the conductive balls are in contact with the redistribution circuit layer through the second openings.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit package, comprising: a semiconductor die comprising an active surface, a plurality of conductive pads disposed on the active surface, and a passivation layer covering the active surface and comprising a plurality of first openings located on the conductive pads; a plurality of conductive vias in contact with the conductive pads respectively; an alignment mark disposed on the semiconductor die and spaced apart from the conductive vias; and an insulating encapsulation encapsulating the semiconductor die and in contact with side surfaces of the conductive vias and the alignment mark, wherein a top surface of the insulating encapsulation is substantially coplanar with top surfaces of the conductive vias and the alignment mark, the alignment mark is disposed on the passivation layer, the alignment mark is separated from the active surface by the passivation layer, a redistribution layer disposed on the insulating encapsulation and the semiconductor die, and the redistribution layer comprising: a redistribution circuit layer in contact with top surfaces of the insulating encapsulation, the conductive vias and the alignment mark; and a dielectric layer disposed on the insulating encapsulation and the redistribution circuit layer.

2. The integrated circuit package as claimed in claim 1, wherein the conductive vias and the alignment mark are disposed side-by-side on the semiconductor die.

3. The integrated circuit package as claimed in claim 2, wherein the conductive vias are electrically connected to the conductive pads through the first openings, and the passivation layer is partially covered by the conductive vias.

4. The integrated circuit package as claimed in claim 1, wherein the alignment mark and the conductive vias are different in shape.

5. The integrated circuit package as claimed in claim 1, wherein the passivation layer is a single-layered passivation layer.

6. The integrated circuit package as claimed in claim 1, wherein the insulating encapsulation comprises a molding compound.

7. The integrated circuit package as claimed in claim 1, further comprising a plurality of conductive balls, wherein the dielectric layer comprises a plurality of second openings disposed on the redistribution circuit layer, and the conductive balls are disposed in the second openings and in contact with the redistribution circuit layer through the second openings.

8. An integrated circuit package, comprising:
a semiconductor die comprising a plurality of conductive pads disposed on an active surface of the semiconductor die and a passivation layer covering the active surface, wherein the passivation layer comprises a plurality of first openings corresponding to the conductive pads;
a plurality of conductive vias disposed in the first openings and in contact with the conductive pads through the first openings;
an alignment mark disposed on the passivation layer and separated from the active surface by the passivation layer, wherein the alignment mark maintains a distance from the first openings;
an insulating encapsulation encapsulating side surfaces of the semiconductor die and in contact with the passivation layer, wherein the alignment mark is separated from the conductive vias by the insulating encapsulation; and
a redistribution layer disposed on the insulating encapsulation and the semiconductor die, wherein a redistribution circuit layer of the redistribution layer is in contact with the alignment mark.

9. The integrated circuit package as claimed in claim 8, wherein the insulating encapsulation contacts and fills between the conductive vias and the alignment mark.

10. The integrated circuit package as claimed in claim 8, wherein a top surface of the insulating encapsulation is substantially coplanar with top surfaces of the conductive vias and the alignment mark.

11. The integrated circuit package as claimed in claim 8, wherein the passivation layer is a single-layered passivation layer.

12. The integrated circuit package as claimed in claim 8, wherein the redistribution layer comprises:
the redistribution circuit layer in contact with top surfaces of the insulating encapsulation, the conductive vias and the alignment mark; and
a dielectric layer disposed on the insulating encapsulation and the redistribution circuit layer.

13. The integrated circuit package as claimed in claim 12, further comprising a plurality of conductive balls, wherein the dielectric layer comprises a plurality of second openings disposed on the redistribution circuit layer, and the conductive balls are disposed in the second openings respectively and in contact with the redistribution circuit layer through the second openings.

14. The integrated circuit package as claimed in claim 8, wherein the conductive vias and the alignment mark are disposed side-by-side on the semiconductor die.

15. A method of fabricating an integrated circuit package, the method comprising:
providing an integrated circuit component which is removably bonded to a carrier, wherein the integrated circuit component comprises a semiconductor die, a plurality of conductive vias and an alignment mark, the conductive vias contact a plurality of conductive pads of the semiconductor die respectively and are spaced apart from the alignment mark;
forming an insulating encapsulation over the carrier to encapsulate the integrated circuit component, wherein the insulating encapsulation fills between the conductive vias and the alignment mark, and contacts side surfaces of the conductive vias and the alignment mark;
grinding the insulating encapsulation until top surfaces of the conductive vias and the alignment mark are revealed, wherein a ground surface of the insulating encapsulation is substantially coplanar with the top surfaces of the conductive vias and the alignment mark; and
forming a redistribution layer over the integrated circuit component and the insulating encapsulation, wherein a redistribution circuit layer of the redistribution layer is in contact with the alignment mark.

16. The method of claim 15, wherein providing the integrated circuit component comprises:
providing a wafer comprising the semiconductor die;
foaming a passivation layer on the wafer, wherein the passivation layer comprises a plurality of first openings corresponding to the conductive pads respectively;
forming a patterned photoresist layer on the passivation layer, wherein the patterned photoresist layer comprises a plurality of first pattern openings and a second pattern opening, the first pattern openings reveals the first openings and the conductive pads, and the second pattern opening reveals the passivation layer;
forming the conductive vias in the first pattern openings and forming the alignment mark in the second pattern opening;
removing the patterned photoresist layer; and
dicing the wafer to form the integrated circuit component.

17. The method of claim 15, wherein a plurality of conductive pillars are formed on the carrier before the integrated circuit component is removably bonded to the carrier, and the insulating encapsulation encapsulates side surfaces of the conductive pillars.

18. The method of claim 15, further comprising:
forming a redistribution circuit layer on the ground surface of the insulating encapsulation, wherein the redistribution circuit layer connects the top surfaces of the conductive vias and the alignment mark; and
forming a dielectric layer on the ground surface of the insulating encapsulation and the redistribution circuit layer, wherein the dielectric layer comprises a plurality of second openings disposed on the redistribution circuit layer.

19. The method of claim 18, further comprising:
forming a plurality of conductive balls in the second openings, wherein the conductive balls are in contact with the redistribution circuit layer through the second openings.

* * * * *